(12) United States Patent
Yao et al.

(10) Patent No.: US 8,507,192 B2
(45) Date of Patent: Aug. 13, 2013

(54) ANTIREFLECTIVE COMPOSITIONS AND METHODS OF USING SAME

(75) Inventors: Huirong Yao, Plainsboro, NJ (US); Guanyang Lin, Whitehouse Station, NJ (US); Jianhui Shan, Pennington, NJ (US); JoonYeon Cho, Bridgewater, NJ (US); Salem K. Mullen, Florham Park, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 655 days.

(21) Appl. No.: 12/708,205

(22) Filed: Feb. 18, 2010

(65) Prior Publication Data

US 2011/0200938 A1    Aug. 18, 2011

(51) Int. Cl.
G03F 7/40 (2006.01)
G03F 7/11 (2006.01)
G03F 7/38 (2006.01)

(52) U.S. Cl.
USPC ........ 430/325; 430/326; 430/271.1; 438/952; 525/417

(58) Field of Classification Search
None
See application file for complete search history.

(56) References Cited

U.S. PATENT DOCUMENTS

| | | | |
|---|---|---|---|
| 3,215,758 A | 11/1965 | Hopkins | |
| 3,279,940 A | 10/1966 | Francis at al. | |
| 3,448,084 A | 6/1969 | Burdick et al. | |
| 3,474,054 A | 10/1969 | White | |
| 3,476,718 A | 11/1969 | Vandenberg | |
| 3,477,996 A | 11/1969 | Formalni | |
| 3,711,391 A | 1/1973 | Feinberg | |
| 3,962,188 A * | 6/1976 | Kauffman | 528/48 |
| 3,962,191 A * | 6/1976 | Kauffman | 528/48 |
| 4,058,537 A | 11/1977 | Mueller | |
| 4,064,191 A | 12/1977 | Parekh | |
| 4,118,437 A | 10/1978 | Parekh | |
| 4,200,729 A | 4/1980 | Calbo | |
| 4,251,665 A | 2/1981 | Calbo | |
| 4,255,558 A | 3/1981 | Turpin | |
| 4,309,529 A | 1/1982 | Wendling | |
| 4,491,628 A | 1/1985 | Ito et al. | |
| 5,187,019 A | 2/1993 | Calbo et al. | |
| 5,350,660 A | 9/1994 | Urano et al. | |
| 5,380,804 A | 1/1995 | Lees et al. | |
| 5,693,691 A | 12/1997 | Flaim et al. | |
| 5,843,624 A | 12/1998 | Houlihan et al. | |
| 5,998,099 A | 12/1999 | Houlihan et al. | |
| 6,042,992 A | 3/2000 | Dammel et al. | |
| 6,132,926 A | 10/2000 | Jung et al. | |
| 6,165,684 A | 12/2000 | Mizutani et al. | |
| 6,274,295 B1 | 8/2001 | Dammel et al. | |
| 6,323,310 B1 | 11/2001 | Puligadda et al. | |
| 6,488,509 B1 | 12/2002 | Ho et al. | |
| 6,509,417 B1 | 1/2003 | Wetzel et al. | |
| 6,686,124 B1 | 2/2004 | Angelopoulos et al. | |
| 7,081,511 B2 | 7/2006 | Wu et al. | |
| 7,332,266 B2 | 2/2008 | Kishioka et al. | |
| 7,416,834 B2 | 8/2008 | Abdallah et al. | |
| 7,470,500 B2 | 12/2008 | Yao et al. | |
| 7,553,905 B2 | 6/2009 | Abdallah et al. | |
| 7,638,262 B2 | 12/2009 | Wu et al. | |
| 7,691,556 B2 | 4/2010 | Wu et al. | |
| 8,221,965 B2 | 7/2012 | Yao et al. | |
| 2002/0076641 A1 | 6/2002 | Coi et al. | |
| 2003/0180559 A1 | 9/2003 | Wayton et al. | |
| 2003/0191203 A1 | 10/2003 | Oohara et al. | |
| 2003/0224283 A1 | 12/2003 | Allen et al. | |
| 2004/0072420 A1 | 4/2004 | Enomoto et al. | |
| 2004/0110096 A1 | 6/2004 | Kishioka et al. | |
| 2004/0253203 A1 | 12/2004 | Hossainy et al. | |
| 2005/0019696 A1 | 1/2005 | Allen et al. | |
| 2005/0215713 A1 | 9/2005 | Hesell et al. | |
| 2006/0134546 A1 | 6/2006 | Huang et al. | |

(Continued)

FOREIGN PATENT DOCUMENTS

| | | |
|---|---|---|
| EP | 0 864 926 A1 | 9/1998 |
| EP | 1 315 043 A1 | 5/2003 |

(Continued)

OTHER PUBLICATIONS

Final Office Action mail date Jan. 5, 2012 for U.S. Appl. No. 12/133,562.

(Continued)

Primary Examiner — Cynthia Hamilton
(74) Attorney, Agent, or Firm — Sangya Jain

(57) ABSTRACT

A novel antireflective coating composition is provided, said antireflective coating composition comprising a) a compound of formula 1, b) a thermal acid generator, (c) at least one polymer,

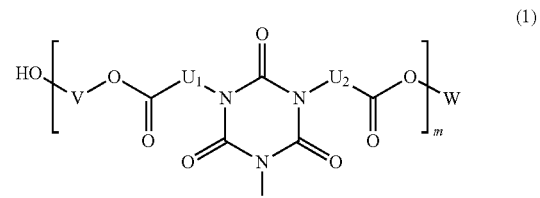

(1)

wherein $U_1$ and $U_2$ are independently a $C_1$-$C_{10}$ alkylene group; V is selected from a $C_1$-$C_{10}$ alkylene, arylene and aromatic alkylene; W is selected from H, $C_1$-$C_{10}$ alkyl, aryl, alkylaryl and V—OH; Y is selected from H, W, and $U_3$C(O)OW, wherein $U_3$ is independently a $C_1$-$C_{10}$ alkylene group, and m is 1 to 10. Also provided are methods using said compositions as antireflective coatings for substrates in lithographic processes.

15 Claims, 3 Drawing Sheets

(56) References Cited

U.S. PATENT DOCUMENTS

| | | | |
|---|---|---|---|
| 2006/0134547 | A1 | 6/2006 | Huang et al. |
| 2006/0210915 | A1 | 9/2006 | Takei et al. |
| 2006/0216652 | A1 | 9/2006 | Kishioka et al. |
| 2006/0234156 | A1 | 10/2006 | Kishioka |
| 2006/0275696 | A1 | 12/2006 | Zampini et al. |
| 2006/0290429 | A1 | 12/2006 | Kishioka et al. |
| 2007/0004228 | A1 | 1/2007 | Hatanaka et al. |
| 2007/0042289 | A1 | 2/2007 | Tahckeray et al. |
| 2007/0122740 | A1 | 5/2007 | Hatakeyama et al. |
| 2008/0008955 | A1 | 1/2008 | Brodsky et al. |
| 2008/0038678 | A1 | 2/2008 | Kishioka et al. |
| 2008/0175882 | A1 | 7/2008 | Trollsas et al. |
| 2008/0206680 | A1 | 8/2008 | Kishioka et al. |
| 2009/0035704 | A1 | 2/2009 | Zhuang et al. |
| 2009/0042133 | A1 | 2/2009 | Xiang et al. |
| 2009/0117493 | A1 | 5/2009 | Kishioka et al. |
| 2009/0246691 | A1 | 10/2009 | Rahman et al. |
| 2009/0274974 | A1 | 11/2009 | Abdallah et al. |
| 2009/0280435 | A1 | 11/2009 | McKenzie et al. |
| 2009/0311624 | A1 | 12/2009 | Horiguchi et al. |
| 2010/0009293 | A1 | 1/2010 | Yao et al. |
| 2010/0009297 | A1 | 1/2010 | Yao et al. |
| 2010/0092894 | A1* | 4/2010 | Liu et al. ............... 430/325 |
| 2010/0256285 | A1 | 10/2010 | Zhao et al. |
| 2011/0250544 | A1 | 10/2011 | Liu et al. |

FOREIGN PATENT DOCUMENTS

| | | |
|---|---|---|
| EP | 1 598 702 A1 | 11/2005 |
| JP | 2002-14474 A | 1/2002 |
| WO | WO 2005/097883 A2 | 10/2005 |

OTHER PUBLICATIONS

Office Action mail date Nov. 29, 2011 for U.S. Appl. No. 12/133,567.
Hilfiker et al "Spectroscopic Ellipsometry Methods for Thin Absorbing Coatings", 51 st Annual Techinical Conference Proceedings, Chicago, IL. Apr. 19-24, 2008, pp. 511-516 obtained from http://www.jawoollam.com/pdf/se_methods_for_thin_absorbing_coatings.pdf?bcsi-ac-2160f1cfec5c399f=1DBC51
A600000102xhmgGsXSN419JAnkCx+V6Kwv7oQXCgAAA-gEAAOLjJQCEAwAAE.
J.A. Woollam Co., Inc, "Spectroscopic Ellipsometry Tutorial" all parts listed with Introduction 14 pages downloaded on Nov. 20, 2011 with the web page for the introduction starting at http://www.jawoollam.com/tutorial_1.html.
"Dispersion Model Basics" from Focus on Appliations part of the Woollam Co. News, Newsletter Issue 4, pates 10-11 copy right J.A. Woollam CO, Inc. Jan. 1, 2003 obtained on Nov. 20, 2001 fromhttp://www.jawoollam.com/Newletters/TechNotes/dispersion_model.pdf.
Office Action mail date Jan. 11, 2011 for U.S. Appl. No. 12/133,562.
Form PCT/IB/326, Form PCT/IB/373, and Form PCT/ISA/237 for PCT/IB2009/005458 dated Jan. 20, 2011 which corresponds to U.S. Appl. No. 12/133,562.
Office Action mail date Jan. 21, 2011 for U.S. Appl. No. 12/133,567.
Form PCT/IB/326, Form PCT/IB/373, and Form PCT/ISA/237 for PCT/IB2009/005486 dated Jan. 20, 2011 which corresponds to U.S. Appl. No. 12/133,567.
Office Action mail date Dec. 9, 2010 for U.S. Appl. No. 12/250,563.
Office Action mail date Feb. 17, 2011 for U.S. Appl. No. 12/250,563.
Notice of Allowance date mailed Mar. 18, 2011 for U.S. Appl. No. 12/250,563.
Notice of Allowance and Fee(s) Due mail dae Mar. 15, 2012 for U.S. Appl. No. 12/133,562.
Office Action mail date Mar. 13, 2012 for U.S. Appl. No. 12/133,567.
Notification of the First Office Action dated May 24, 2012 from the Chinese Patent Office for Patent Application No. CN 200980120871.4, which corresponds to U.S. Appl. No. 12/133,567.
English Language Translation of Notification of the First Office Action dated May 24, 2012 from the Chinese Patent Office for Patent Application No. CN 200980120871.4, which corresponds to U.S. Appl. No. 12/133,567.
Form PCT/IB/326, Form PCT/IB/373, and Form PCT/ISA/237 for PCT/IB2009/007116 dated Apr. 28, 2011 which corresponds to U.S. Appl. No. 12/250,563.
Communication pursuant to Rules 161(1) and 162 EPC for EP 09744168.9 dated Jun. 7, 2011, which corresponds to U.S. Appl. No. 12/250,563.
PCT/ISA/220, Form PCT/ISA/210, and Form PCT/ISA/237 for PCT/IB2011/000370 dated May 30, 2011, which corresponds to U.S. Appl. No. 12/708,205.
Office Action mail date Jul. 18, 2011 for U.S. Appl. No. 12/133,562.
Communication pursuant to Article 94(3) EPC (EPO Form 2001) dated Jun. 20, 2011 for EP 09 785 890.6, which corresponds to U.S. Appl. No. 12/133,562.
Complete set of specification papers for U.S. Appl. No. 13/162,065, filed Jun. 16, 2011 with cover page.
Notification of the First Office Action dated Jul. 17, 2012 for Chinese Patent Application No. 200980140489.X, which corresponds to U.S. Appl. No. 12/250,563.
Engl. Lang. Transl. of Notification of the First Office Action dated Jul. 17, 2012 for Chinese Patent Application No. 200980140489.X, which corresponds to U.S. Appl. No. 12/250,563.
Office Action mail date Jul. 31, 2009 for U.S. Appl. No. 11/836,980.
Office Action mail date Nov. 3, 2009 for U.S. Appl. No. 11/836,980.
Form PCT/ISA/210 for PCT/IB2008/002132 dated Mar. 3, 2009, which corresponds to U.S. Appl. No. 11/836,980.
Form PCT/IB/326 and Form PCT/IB/237 for PCT/IB2008/002132 dated Feb. 25, 2010, which corresponds to U.S. Appl. No. 11/836,980.
Office Action mail date Jan. 25, 2010 for U.S. Appl. No. 12/133,562.
Office Action mail date Mar. 30, 2010 for U.S. Appl. No. 12/133,562.
Form PCT/ISA/220, Form PCT/ISA/210, and Form PCT/ISA/237 for PCT/IB2009/005458 dated Aug. 4, 2009, which corresponds to U.S. Appl. No. 12/133,562.
Office Action mail date Mar. 19, 2010 for U.S. Appl. No. 12/133,567.
Office Action mail date Jul. 27, 2010 for U.S. Appl. No. 12/133,567.
Form PCT/ISA/220, Form PCT/ISA/210, and Form PCT/ISA/237 for PCT/IB2009/005486 dated Sep. 1, 2009, which corresponds to U.S. Appl. No. 12/133,567.
Office Action mail date Mar. 10, 2010 for U.S. Appl. No. 12/250,563.
Office Action mail date Jun. 22, 2010 for U.S. Appl. No. 12/250,563.
Form PCT/ISA/206 for PCT/IB2009/007116 dated Feb. 15, 2010, which corresponds to U.S. Appl. No. 12/250,563.
Form PCT/ISA/220, Form PCT/ISA/210, and Form PCT/ISA/237 for PCT/IB2009/007116 dated Apr. 29, 2010, which corresponds to U.S. Appl. No. 12/250,563.
"Cymel 303 Crosslinking Agent", Cytec Industries, Inc., West Paterson, NJ, 1995 copyright date, product bulletin obtained from http://www.cytec.co/Liquids/Downloads/CYMEL%20303%20-%20Crosslinking%20Agent_Americas_En.pdf.
"epoxy-Definition" mondofacto Oct. 2008, from http://www.mondofacto.com/facts/dictionary? epoxy, dated entry May 5, 2000, downloaded Jun. 18, 2010, one page.
"epoxy compounds", PAC, 1995, 67, 1307 (glossary of class names of organic compounds and reactivity intermediates based on structure (IUPAC Recommendations 1995) on p. 1334, downloaded from http://goldbook.iupac.org/e02173-plain.html16/18/10, downloaded on Jun. 18, 2010, one page.
"hycrocarbylene groups", IUPAC Compendium of Chemical Terminology, Second Edition (1997), obtained from http://goldbook.iupac.org/H02890.html.
Marvel et al., "Polythiolesters", J. of Am. Chem. Soc. vol. 73, No. 3, pp. 1100-1102, Year 1951.
Mizutani et al., "Design of a new bottom antireflective coating composition for KrF resist", SPIE vol. 3678 Part 1, pp. 518-526 (Mar. 1999).
"moiety", IUPAC Compendium of Chemical Terminology, Second Edition (1997), obtained from http://www.iupac.org/goldbook/M03968.pdf.
Office Action mail date Aug. 21, 2012 for U.S. Appl. No. 13/162,065.

Office Action mail date Oct. 13, 2010 for U.S. Appl. No. 12/133,562.
Office Action mail date Sep. 23, 2010 for U.S. Appl. No. 12/250,563.
Notification of the Second O.A. dated Dec. 17, 2012 from the Chinese Patent Office for Patent Application No. CN 200980120871.4, which corresponds to U.S. Appl. No. 12/133,563.

Engl. Lang. Trans. of Notification of the Second O.A. dated Dec. 17, 2012 from the Chinese Patent Office for Patent Application No. CN 200980120871.4, which corresponds to U.S. Appl. No. 12/133,567.

* cited by examiner

ANTIREFLECTIVE COMPOSITIONS AND METHODS OF USING SAME

FIELD OF THE INVENTION

The present invention relates to novel antireflective compositions comprising at least one polymer resin, a compound which is a hyper refractive index (n) enhancer, and a thermal acid generator. The present invention also relates to methods of using such hyper refractive index compositions as antireflective substrate coatings in photolithographic processes. Photolithography is a photo-chemical process for forming a photoresist pattern, which can then be transferred to the substrate by etching. Such photo-chemical processes are used to make integrated circuits and computer chips. An integrated circuit is made from a silicon wafer, known as a substrate, having a complete electronic circuit incorporated on its surface. Immersion lithography is a technique that is used to extend the resolution limits of deep ultraviolet lithography imaging. Rather than using air or some other low refractive index gas between the lens and wafer plane, as is done in dry lithography imaging, immersion lithography dispenses a fluid between the objective lens and the wafer, thereby permitting higher orders of light to participate in image formation at the wafer plane. The process of immersion lithography is described in "Immersion liquids for lithography in deep ultraviolet" Switkes et al. Vol. 5040, pages 690-699, Proceedings of SPIE.

Typically in such a microlithographic processes, a substrate is coated with a thin photosensitive film, known as a photoresist. Then, the photoresist-coated substrate is baked to evaporate any solvent in the photoresist composition and to fix the coating onto the substrate. The baked photoresist-coated surface of the substrate is subsequently subjected to an image-wise exposure to radiation.

Upon radiation exposure, the exposed areas of the coated surface undergo a chemical transformation. Forms of radiation commonly used in microlithographic processes, including immersion lithography, include visible light, ultraviolet (UV) light, electron beam, extreme ultra violet (euv) and X-ray radiant energy. Typically, the radiation exposure is accomplished by radiating the film with light of a select wavelength through a patterned mask. The exposed photoresist delineates the pattern that is transferred to the substrate, and eventually incorporated into the integrated circuit. After this image-wise exposure, the coated substrate is treated with a developer solution to dissolve and remove either the radiation-exposed or the unexposed areas of the photoresist.

Integrated circuits (IC) are becoming increasingly smaller with photolithographic processes producing circuit elements with dimensions that are sub-micrometer, e.g., about one-half of a micrometer. However, scattered light that reflects off the substrate during the exposure step of photolithography interferes with the desired exposure profiles, and thus with attaining sub-micron IC elements.

A precise exposure procedure is essential to transfer sub-micrometer design features to the photoresist, including delivering the correct dose of radiation and transferring the right pattern, to accurately control sub-micrometer IC element dimensions. The precision of the exposure procedure is adversely affected by light that reflects off the substrate and travels back through the photoresist. Such reflected light can travel through previously unexposed photo-resist and in effect alter the pattern that was transferred. Another adverse effect can occur when the reflected light travel backs through the exposed photoresist and interferes with the radiation being delivered to vary the dose of radiation that is absorbed in the photoresist.

The resulting interference may cause the radiation dose needed to develop the photo-resist to change as a function of the thickness of the photoresist. The sensitivity to resist thickness is emphasized at the shorter wavelengths, which are required to achieve sub-micrometer design features. The deleterious effects of reflected light are referred to as interference effects. These interference effects are visible as non-vertical photoresist profiles, changes in critical line width dimensions and reflective notching.

Absorbing antireflective coatings are used in photolithography to reduce problems that result from back reflection of light from highly reflective substrates. Examples of antireflective coatings are described in U.S. Pat. No. 7,553,905 and U.S. Patent Application Publication Nos. 20090246691, 20090274974, 20090280435, which are incorporated herein by reference in their entirety.

An antireflective coating that is coated beneath a photoresist and above a reflective substrate provides considerable improvement in lithographic performance of the photoresist. Such an antireflective coating is known as a bottom antireflective coating (BARC). Typically, the bottom antireflective coating is coated onto the substrate and then a layer of photoresist is coated on top of the antireflective coating. The antireflective coating is baked (cured) to prevent intermixing between the antireflective coating and the photoresist. The photoresist is exposed image-wise and developed. The antireflective coating in the exposed area is then typically dry etched using various etching gases, thereby transferring the photoresist pattern to the substrate.

In addition to antireflection properties, advanced bottom antireflective coatings also provide enhanced pattern transfer properties to the substrate. As described in U.S. Pat. No. 7,416,834, when a single layer pattern transfer lithography process, high etch rate bottom antireflective coatings preserve photoresist film thickness so it can act as a thicker mask in transferring the image to the substrate.

Hyper refractive index (n) antireflective compounds and hyper refractive index coatings comprising such hyper n compounds, having a high etch rate, are desired to achieve the best resolution and profile of the pattern transferred to the substrate in the immersion lithography process.

Accordingly, there is a need for better antireflective compositions for improved lithographic performance of the imaging process to efficiently accomplish the transfer of a pattern to a substrate so that the line and space patterns are free of defects such as standing waves, footing and scumming.

The present applicants of the present invention have made more efficient bottom antireflective coatings. The antireflective coating compositions comprise a refractive index enhancer compound. The improved anti-reflective substrate coatings achieve a high etch rate in photolithographic processes, specifically immersion lithography.

The present invention provides compositions comprising a compound having formula 1 (a hyper refractive index (n) enhancer compound), a thermal acid generator, at least one polymer and an optional crosslinker. The present invention also provides methods of using said compositions as antireflective coatings for substrates in lithographic processes, wherein a high etch rate is achieved using the provided antireflective compositions.

SUMMARY OF THE INVENTION

Figure 1:
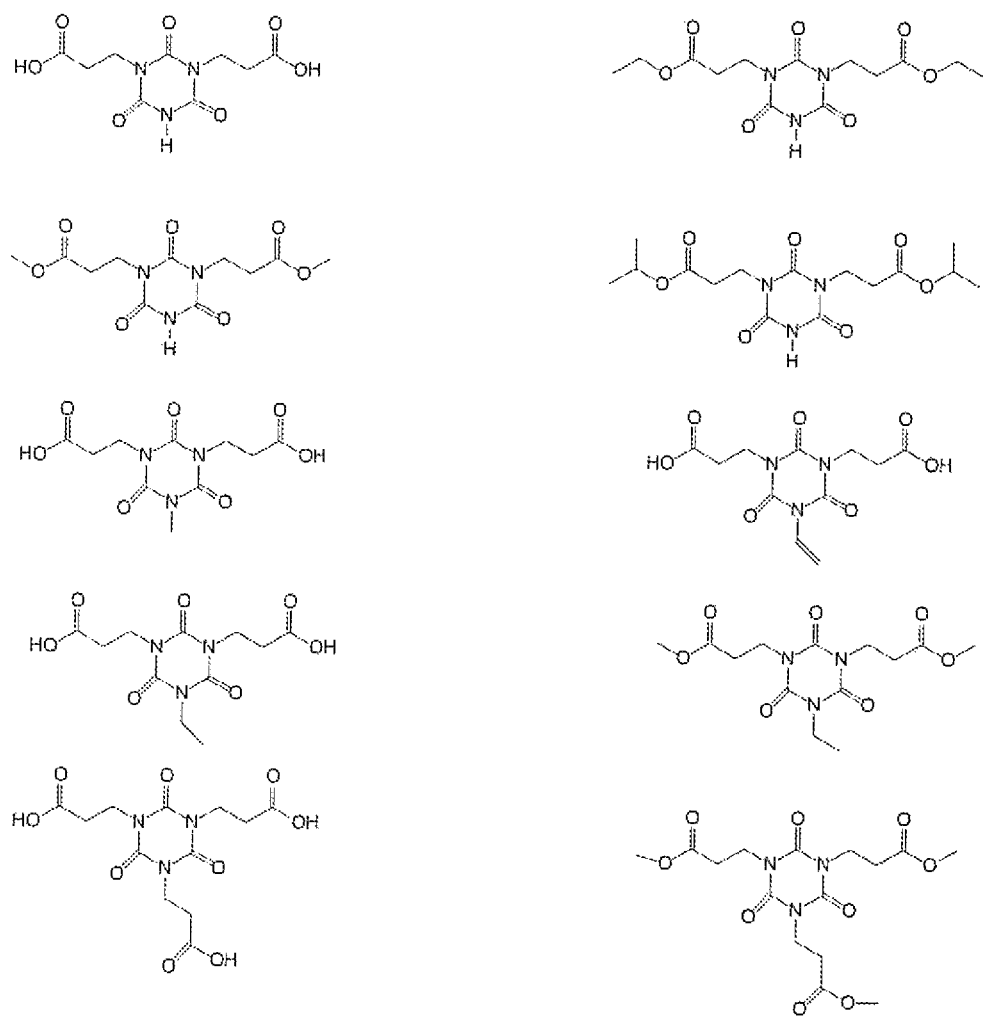
FIG. 1 shows monomers, which may be used to form the hyper n enhancer compound structures.

The present invention relates to novel antireflective compositions comprising at least one polymer resin, a compound of formula 1, which is a hyper refractive index "n" enhancer, and a thermal acid generator. The composition may additionally comprise a crosslinker or be free of an additional crosslinker. The present invention also relates to methods of using such compositions as antireflective substrate coatings in photolithographic processes.

The present invention relates to an antireflective coating composition comprising a) a compound of formula 1, b) a thermal acid generator, (c) at least one polymer,

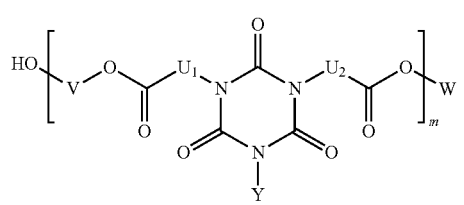

(1)

wherein $U_1$ and $U_2$ are independently a $C_1$-$C_{10}$ alkylene group; V is selected from a $C_1$-$C_{10}$ alkylene, arylene and aromatic alkylene; W is selected from H, alkyl, aryl, alkylaryl and V—OH; Y is selected from H, W, and $U_3C(O)OW$, wherein $U_3$ is independently a $C_1$-$C_{10}$ alkylene group, and m is 1 to 10. The invention also relates to using said compositions as antireflective coatings for substrates in lithographic processes.

DETAILED DESCRIPTION OF THE INVENTION

The present invention relates to novel antireflective compositions comprising at least one polymer, a compound which is referred to herein as "a hyper refractive index (n) enhancer," a thermal acid generator and an optional crosslinker. The composition may comprise the crosslinker or be free of the crosslinker. The composition is capable of being crosslinked. The refractive index of the composition can be 1.7 or above. In one embodiment the refractive index of the antireflective composition is optimized to 1.9 or above. The invention also relates to a process for imaging a photoresist layer coated with the novel antireflective coating layer. In one embodiment a high etch rate and a refractive index of 1.9 or greater is achieved using the provided antireflective compositions, wherein the etch rate of the antireflective coating film is at least 1.5 times higher than the etch rate of the photoresist film coated above the antireflective film.

The present invention relates to an antireflective coating composition comprising a) an enhancer compound of formula 1, b) a thermal acid generator, (c) at least one polymer, and d) an optional crosslinker, where formula 1 is represented by,

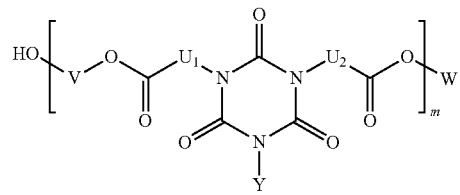

(1)

wherein $U_1$ and $U_2$ are independently a $C_1$-$C_{10}$ alkylene group; V is selected from a $C_1$-$C_{10}$ alkylene, arylene and aromatic alkylene; W is selected from H, $C_1$-$C_{10}$ alkyl, aryl, alkylaryl and V—OH; Y is selected from H, W, and $U_3C(O)OW$, wherein $U_3$ is independently a $C_1$-$C_{10}$ alkylene group, and m is 1 to 10. In an embodiment, m is 1 to 5, wherein m is any of 1 to 5 or a mixture thereof. In one embodiment m=1 or 2. In one embodiment m=1.

Herein throughout the present application: alkylene may be a straight alkylene, branched alkylene, cycloalkylene, nonaromatic unsaturated equivalents; alkyl may be straight alkyl, branched alkyl, cycloalkyl, or nonaromatic unsaturated equivalents; aromatic alkylene is a group comprising a mixture of aromatic and alkylene groups, where the aromatic group may be in the alkylene chain, or where the aromatic group may be pendant from the alkylene chain or where the aromatic group may be attached to the alkylene chain and attached to the main structure.

In another embodiment an example of the compound of formula 1 is formula 2

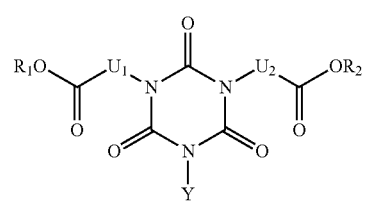

(2)

wherein $R_1$ is independently selected from the group consisting of hydrogen (H), a $C_1$-$C_{10}$alkyl group, an aryl, an alkylaryl group, and hydroxyalkyl group, $R_2$ is V—OH, and V, Y, $U_1$ and $U_2$ are as described herein. In an embodiment, $R_1$ is selected from hydrogen; an alkyl such as a methyl group, an ethyl group, a propyl group, a tert-butyl group; a hydroxyalkyl such as hydroxy ethyl group, a hydroxy propyl group, hydroxy butene, hydroxybutyne, and the like. $R_2$ is selected from hydroxyalkyl group such as hydroxy ethyl group, a hydroxy propyl group, hydroxy butene, and hydroxybutyne.

In another embodiment, an example of the compound of formula 1 is formula 3

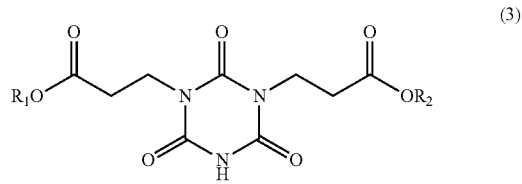

(3)

wherein $R_1$ is independently selected from the group consisting of hydrogen (H), a $C_1$-$C_{10}$ alkyl group, an aryl group, an alkylaryl and hydroxyalkyl group, $R_2$ is V—OH, and V, Y, $U_1$ and $U_2$ are as described herein. In an embodiment, $R_1$ is selected from hydrogen; an alkyl such as a methyl group, an ethyl group, a propyl group, a tert-butyl group; a hydroxyalkyl such as hydroxy ethyl group, a hydroxy propyl group, hydroxy butene, hydroxybutyne, and the like. $R_2$ is selected from hydroxyalkyl group such as hydroxy ethyl group, a hydroxy propyl group, hydroxy butene, and hydroxybutyne.

In another embodiment an example of the compound of formula 1 is formula 4

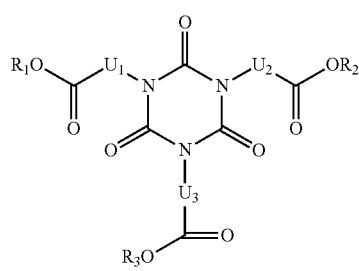

(4)

wherein $R_1$ and $R_3$ is independently selected from the group consisting of hydrogen (H), a $C_1$-$C_{10}$ alkyl group, an aryl group, an alkylaryl and hydroxyalkyl group, $R_2$ is V—OH, and V, $U_1$, $U_2$ and $U_3$ are as described above. In an embodiment, $R_1$ and $R_3$ is independently is selected from hydrogen, an alkyl or hydroxyalkyl group such as methyl group, an ethyl group, a propyl group, a tert-butyl group, a hydroxy ethyl group, a hydroxy propyl group, hydroxy butene, hydroxybutyne, and the like. $R_2$ is selected from hydroxyalkyl group such as hydroxy ethyl group, a hydroxy propyl group, hydroxy butene, and hydroxybutyne. In an embodiment only one of $R_1$, and $R_3$ is hydrogen. In another embodiment none of $R_1$, and $R_3$ are hydrogen.

In another embodiment, an example of the compound of formula 1 is formula 5

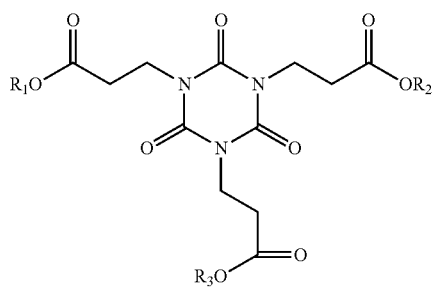

(5)

wherein $R_1$ and $R_3$ is independently selected from the group consisting of hydrogen (H), a $C_1$-$C_{10}$ alkyl group, an aryl group, an alkylaryl and hydroxyalkyl group, $R_2$ is V—OH, and V is as above. In an embodiment, $R_1$ and $R_3$ is independently is selected from hydrogen, an alkyl group and hydroxyalkyl group such as a methyl group, an ethyl group, a propyl group, a tert-butyl group, a hydroxy ethyl group, a hydroxy propyl group, hydroxy butene, hydroxybutyne, and the like. $R_2$ is selected from hydroxyalkyl group such as hydroxy ethyl group, a hydroxy propyl group, hydroxy butene, and hydroxybutyne.

In an embodiment, an example of compound of formula 1 may be exemplified by the following structure 6:

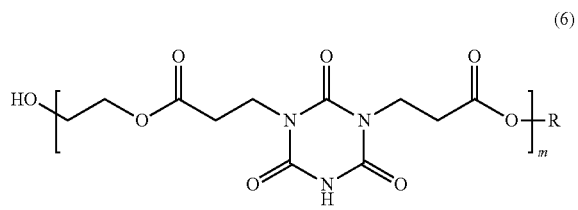

(6)

wherein R is selected from a hydrogen; a $C_1$-$C_{10}$ alkyl group and a hydroxyalkyl group, such as a methyl group, an ethyl group, a propyl group, a tert-butyl group, an hydroxy ethyl group and a hydroxy propyl group and hydroxybutene, hydroxybutyne, and the like; and m is from 1 to 5, but may be larger, i.e., up to 10. Mixtures of compounds of formula 6 of different values of m, wherein m=1 to 10 or wherein m=1 to 5 may be present in the composition.

In another embodiment, an example of compound of formula 1 may be exemplified by the following structure 7:

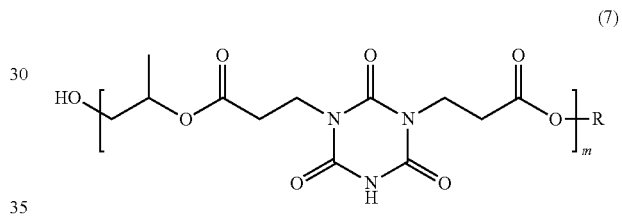

(7)

wherein R is selected a hydrogen, a $C_1$-$C_{10}$ alkyl group and a hydroxyalkyl group, such as a methyl group, an ethyl group, a propyl group, a tert-butyl group, a hydroxyalkyl group such as a hydroxy ethyl group or a hydroxy propyl group; and m is from any of 1 to 5, but may be larger, i.e., up to 10. Mixtures of different values of m of where m=1 to 10 or m=1 to 5 of formula 7 may be present in the composition.

Figure 2:
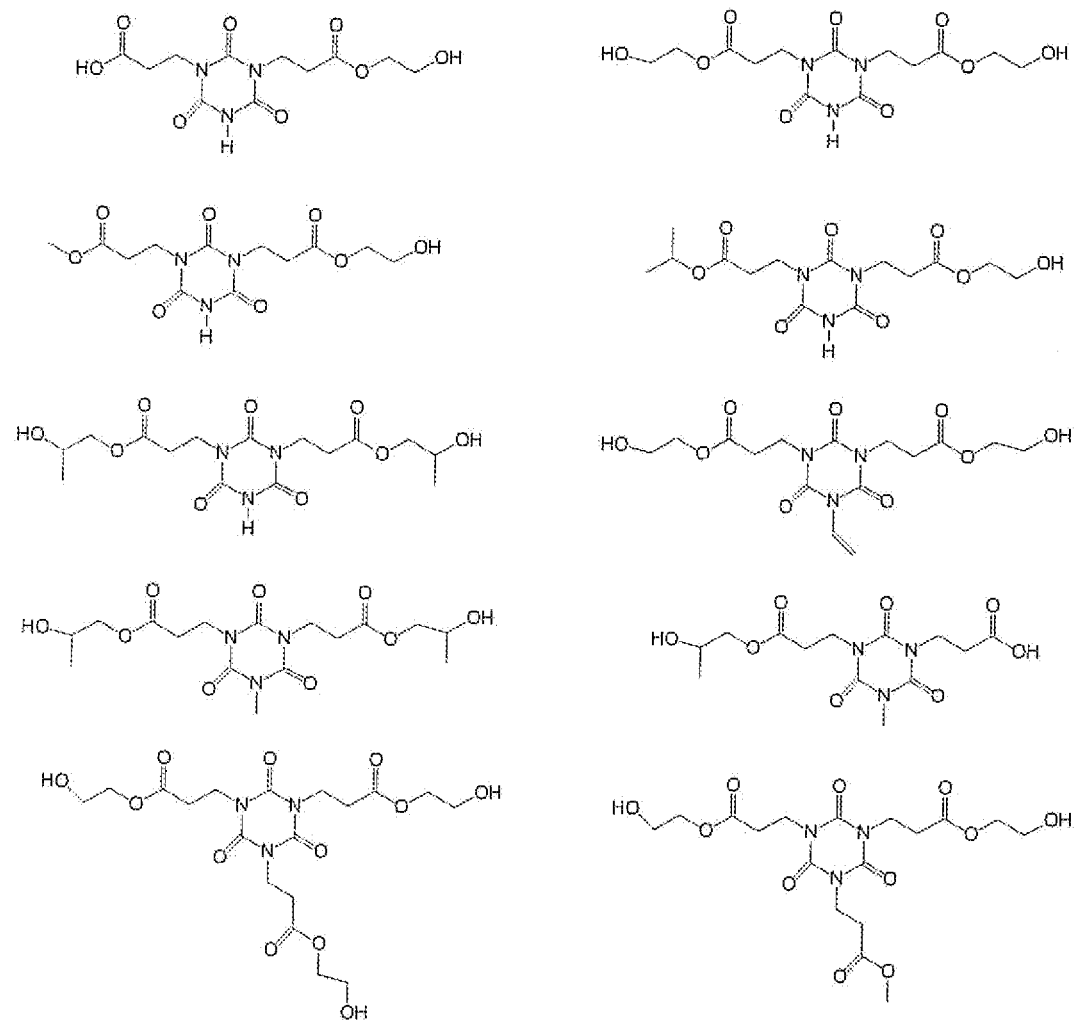
FIG. 2 shows examples of hyper n enhancer product structures.
Figure 3:
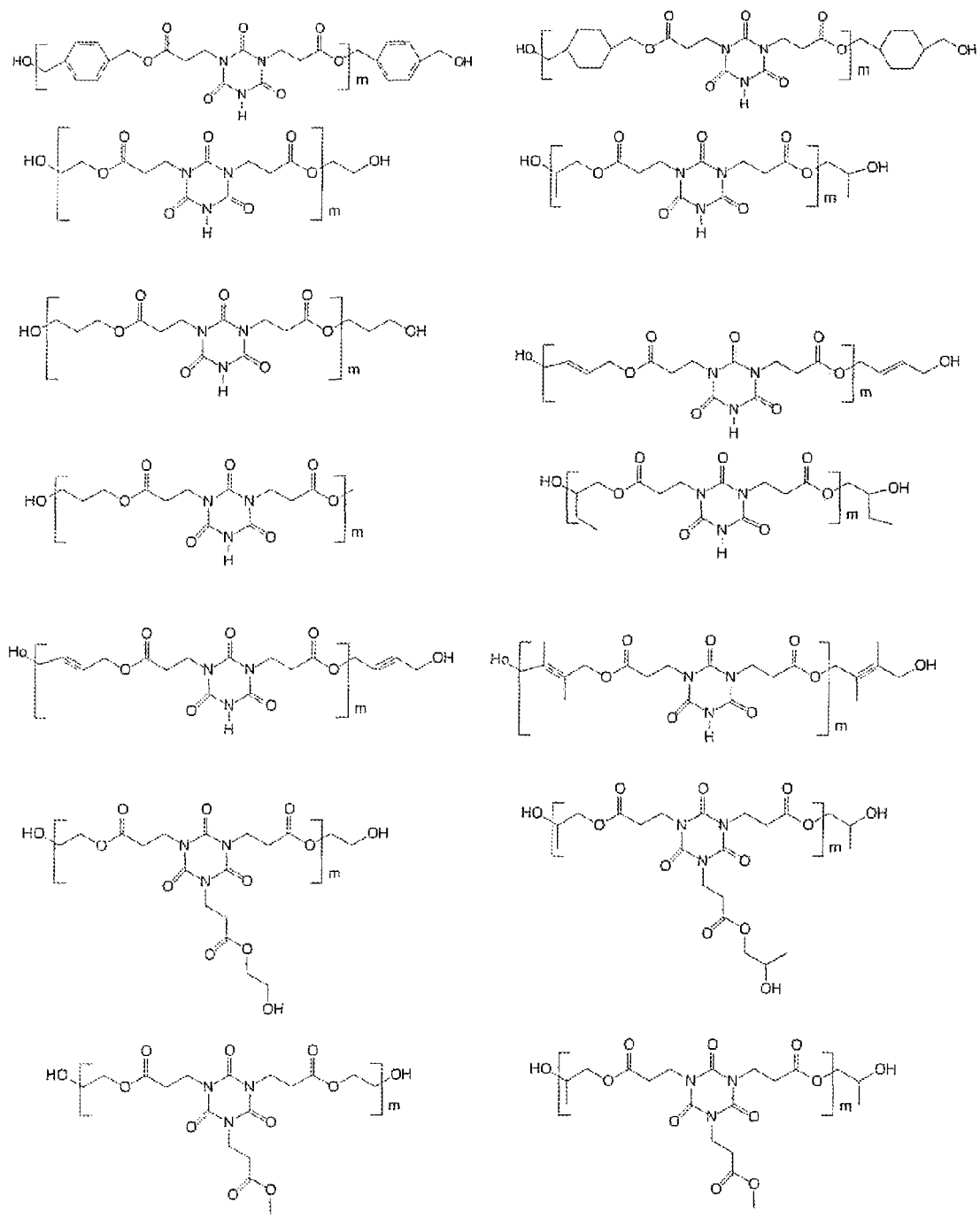
FIG. 3 shows examples of hyper refractive index (n) polymer products.

Examples of monomers which may be used to form the hyper n enhancer compound structures used in synthesis are shown in FIG. 1, but are not limited thereto. Examples of hyper n enhancer product structures are shown in FIG. 2, but are not limited thereto. Examples of hyper refractive index (n) polymer products are shown in FIG. 3, but are not limited thereto. The compound having formula 1 in antireflective coating composition can be a molecule, an oligomer, or a polymer containing one or more hydroxyl groups. Formula 1 can be obtained by reacting a polyhydroxy compound with compound (8 or 9) having one of the following structures.

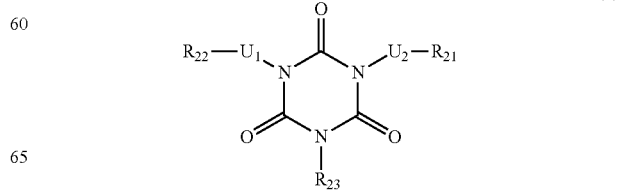

(8)

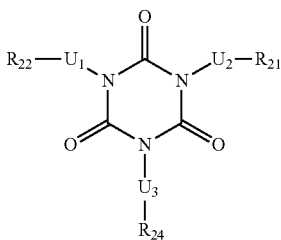

(9)

where $U_1$, $U_2$ and $U_3$ are each independently a $C_1$-$C_{10}$ alkylene group, $R_{21}$, $R_{22}$ and $R_{24}$ each represent a carboxylic acid or acid ester group, and $R_{23}$ is hydrogen or $C_1$-$C_{10}$ alkyl or $C_1$-$C_{10}$ unsaturated alkyl. In some cases, compound having formula 1 can be obtained by reacting epoxide compounds with compound (8 or 9). The reaction is usually done in the presence of a catalyst, for example, benzyltriethylammonium chloride. The concentration of the polyhydroxy compound can be varied to control the value of m in formula 1.

The term "alkyl" as used herein means a straight, branched or cyclic chain hydrocarbon. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl. Alkyl may also refer to alkyl groups that comprise an unsaturated double or triple bond, but are nonaromatic. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Unless otherwise stated, alkyl refers to 1-10 carbon atom moieties.

Alkylene groups are divalent alkyl groups derived from any of the alkyl groups mentioned hereinabove. When referring to alkylene groups, these include an alkylene chain substituted with ($C_1$-$C_6$)alkyl groups in the main carbon chain of the alkylene group. Alkylene groups can also include one or more alkene or alkyne groups in the alkylene moiety, where alkene and alkyne refers to a double and triple bond respectively. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-hexene, 2,5-dimethyl-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis(methylene)-tricyclo[5.2.1.0.$^{2,6}$]decane. Unless otherwise stated, alkyl refers to 1-10 carbon atom moiety.

The term "aryl" as used herein means a radical derived from an aromatic hydrocarbon by the elimination of one atom of hydrogen and can be substituted or unsubstituted. Arylene is a divalent aromatic radical.

As used herein, the term "alkoxy" refers to a group of alkyl-O—, where alkyl is defined herein. Representative examples of alkoxy include, but are not limited to, methoxy, ethoxy, propoxy, 2-propoxy, butoxy, tert-butoxy, pentyloxy, and hexyloxy.

The term aryloxy, as used herein means to a group of aryl-O—, where aryl is defined herein.

The polyhydroxy (more than 2 hydroxy groups) or epoxy compound to form the enhancer may be exemplified by ethylene glycol, diethylene glycol, propylene glycol, neopentyl glycol, polyethylene glycol, styrene glycol, propylene oxide, ethylene oxide, butylene oxide, hexane diol, butane diol, butane diol, butyne diol, 1-phenyl-1,2-ethanediol, 2-bromo-2-nitro-1,3-propane diol, 2-methyl-2-nitro-1,3-propanediol, diethylbis(hydroxymethyl)-malonate, hydroquinone, and 3,6-dithia-1,8-octanediol. Further examples of aromatic diols are (2,2-bis(4-hydroxyphenyl) propane), 4,4'-isopropylidenebis(2,6-dimethylphenol), bis(4-hydroxyphenyl)methane, 4,4'-sulfonyldephenol, phenylened iisopropylidene)bisphenol, 4,4'-(1,4 phenylenediisopropylidene)bisphenol, 4,4'-cyclohexylidenebisphenol, 4,4'-(1-phenylethylidene)bisphenol, 4,4'-ethylidenebisphenol, 2,2-bis(4-hydroxy-3-tert-butylphenyl) propane; 2,2-bis(4-hydroxy-3-methylphenyl)propane, 1,1-bis(4-hydroxyphenyl)ethane; 1,1-bis(4-hydroxyphenyl)isobutane; bis(2-hydroxy-1-naphthyl)methane; 1,5-dihydroxynaphthalene; 1,1-bis(4-hydroxy-3-alkylphenyl)ethane, 2,2-bis(3-sec-butyl-4-hydroxyphenyl) propane, 2,2-bis(4-hydroxy-3-isopropylphenyl)propane, 2,2-bis(4-hydroxyphenyl)butane, α,α'-bis(4-hydroxy-3,5-dimethylphenyl)-1,4-diisopropylbenzene, 2,6-bis(hydroxymethyl)-p-cresol and 2,2'-(1,2-phenylenedioxy)-diethanol, 1,4-benzenedimethanol, 2-benzyloxy-1,3-propanediol, 3-phenoxy-1,2-propanediol, 2,2'-biphenyldimethanol, 4-hydroxybenzyl alcohol, 1,2-benzenedimethanol, 2,2'-(o-phenylenedioxy)diethanol, 1,7-dihydroxy-naphthalene, 1,5-naphthalenediol, 9,10-anthracenediol, 9,10-anthracenedimethanol, 2,7,9-anthracenetriol, other naphthyl diols and other anthracyl diols.

Examples of aromatic oxides include, but are not limited to, styrene oxide, 1,2-epoxy-phenoxypropane, glycidyl-2-methylphenyl ether, (2,3-epoxypropyl)benzene, 1-phenyl-propylene oxide, stilbene oxide, 2- (or 3- or 4-)halo(chloro, fluoro, bromo, iodo) stilbene oxide, benzyl glycidyl ether, $C_{1-10}$ straight or branched chain alkyl(e.g., methyl, ethyl, propyl, butyl, sec-butyl, tert-butyl, pentyl, hexyl, heptyl, and the like etc)phenyl glycidyl ether, 4-halo(chloro, fluoro, bromo, iodo)phenyl glycidyl ether, glycidyl 4-$C_{1-10}$ straight or branched chain alkoxy(e.g., methoxy, ethoxy, propoxy, butoxy, hexyloxy, heptyloxy, and the like etc)phenyl ether, 2,6-dihalo(chloro, fluoro, bromo, iodo)benzylmethyl ether, 3,4-dibenzyloxybenzyl halide (chloride, fluoride, bromide, iodide), 2- (or 4-) methoxybiphenyl, 3,3'- (or 4,4'-)di$C_{1-10}$ straight or branched chain alkoxy (e.g., methoxy, ethoxy, propoxy, butoxy, hexyloxy, heptyloxy, and the like etc) biphenyl, 4,4'-dimethoxyoctafluorobiphenyl, 1- (or 2-)$C_{1-10}$ straight or branched chain alkoxy (e.g., methoxy, ethoxy, propoxy, butoxy, hexyloxy, heptyloxy, and the like etc) naphthalene, 2-halo(chloro, fluoro, bromo, iodo)-6-methoxynaphthalene, 2,6-di$C_{1-10}$ straight or branched chain alkoxy(e.g., methoxy, ethoxy, propoxy, butoxy, hexyloxy, heptyloxy, and the like etc)naphthalene, 2,7-di$C_{1-10}$ straight or branched chain alkoxy(e.g., methoxy, ethoxy, propoxy, butoxy, hexyloxy, heptyloxy, and the like etc)naphthalene, 1,2,3,4,5,6-hexahalo(chloro, fluoro, bromo, iodo)-7-$C_{10}$ straight or branched chain alkoxy(e.g., methoxy, ethoxy, propoxy, butoxy, hexyloxy, heptyloxy, and the like etc)naphthalene, 9,10-bis(4-$C_{1-10}$ straight or branched chain alkoxy(e.g., methoxy, ethoxy, propoxy, butoxy, hexyloxy, heptyloxy, and the like etc)phenyl)-anthracene, 2-$C_{1-10}$ straight or branched chain alkyl(e.g., methyl, ethyl, propyl, butyl, sec-butyl, tert-butyl, pentyl, hexyl, heptyl, and the like etc)-9,10-di$C_{1-10}$ straight or branched chain alkoxy(e.g., methoxy, ethoxy, propoxy, butoxy, hexyloxy, heptyloxy, and the like etc)anthracene, 9,10-bis(4-$C_{1-10}$ straight or branched chain alkoxy (e.g., methoxy, ethoxy, propoxy, butoxy, hexyloxy, heptyloxy, and the like etc)phenyl)-2-halo(chloro, fluoro, bromo, iodo)-anthracene, 2,3,6,7,10,11-hexamethoxytriphenylene, glycidyl-3-(pentadecadienyl)phenyl ether, 4-t-butylphenylglycidyl ether, triphenylolmethane triglycidyl ether, [(4-(1-heptyl-8-[3-(oxiranylmethoxy)phenyl]-octyl)phenoxy)methyl]oxirane, tetraphenylolethane tetra-glycidyl ether, hydroxyphenol diglycidyl ether, etc.

Examples of aliphatic oxides include ethylene oxide, propylene oxide, butylene oxides, including isobutylene oxide, 1,2-butylene oxide and 2,3-butylene oxide, pentylene oxide, cyclohexene oxide, decyl glycidyl ether, and dodecyl glycidyl ether.

Nonlimiting examples of compound (8 and 9) which can be reacted are disclosed in FIG. 1.

The weight average molecular weight of the enhancer can range from about 250 to about 3,000. The weight average molecular weight of the enhancer can range from about 300 to about 2,000. The weight average molecular weight of the enhancer can range from about 300 to about 1,000. in one embodiment the enhancer of formula 1 in the composition may be a mixture of m=1 and m=2. In the mixture the ratio of the enhancer mixture where m=1:m=2 can range from about 10:1 to about 1:1, or where m=1:m=2 can range from about 4:1 to about 1:1. In one embodiment the enhancer may comprise a mixture of components where m=3-10.

Antireflective coatings of the present invention are formulated by blending the hyper n enhancer compound with at least one polymer together with a solvent and a thermal acid generator. The anti-reflective coating composition of the present invention comprises: (a) a hyper n enhancer, (b) at least one polymer, (c) a thermal acid generator and (d) a solvent, and (e) an optional crosslinker. The polymer (b) of the antireflective coating composition may be either a crosslinker polymer or a cross-linkable polymer. The polymer crosslinks when baked to become insoluble in the coating solvent of the photoresist. In one embodiment the composition comprises (a) a hyper n enhancer, (b) at least one crosslinker polymer, (c) a thermal acid generator and (d) a solvent, (e) an optional crosslinking agent, and (f) optional crosslinkable polymer. In one embodiment the composition comprises (a) a hyper n enhancer, (b) at least one crosslinker polymer, (c) a thermal acid generator and (d) a solvent, (e) an optional crosslinking agent, and no crosslinkable polymer. In one embodiment the composition comprises (a) a hyper n enhancer, (b) at least one crosslinkable polymer, (c) a thermal acid generator and (d) a solvent, (e) an optional crosslinking agent, and (f) optional crosslinker polymer, but at least one of (e) or (f) is present. A crosslinker is present which may be monomeric, oligomeric or polymeric when a crosslinkable polymer is present in the composition to form a cured coating. A crosslinker polymer without a crosslinking agent can be cured to form a cured coating.

A variety of crosslinker or crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6bishydroxymethyl p-cresol may be used.

Typically, the crosslinker polymer is a compound that can act as an electrophile and can, alone or in the presence of an acid, form a carbocation. Thus, compounds containing groups such as alcohol, ether, ester, olefin, methoxymethylamino, methoxymethylphenyl and other molecules containing multiple electrophilic sites, are capable of crosslinking. The crosslinker polymer is capable of self crosslinking. Polymeric crosslinkers, such as polymers of glycoluril and polyols, may also be used. A crosslinker may be selected from, but not limited to, melamines, methylols, glycolurils, polymeric glycolurils, hydroxy alkyl amides, epoxy and epoxy amine resins, blocked isocyanates, polymeric crosslinkers, and divinyl monomers. Crosslinking agents disclosed in US 2006/0058468 and incorporated herein by reference, where the crosslinking agent is a polymer obtained by reacting at least one glycoluril compound with at least one reactive compound containing at least one hydroxy group and/or at least one acid group may be used.

The crosslinker polymer, when used in the composition, may be present at about 5 weight percent to about 95 weight percent of total solids.

In an embodiment, the crosslinker polymer is formed from the condensation reaction of glycoluril with a reactive comonomer containing hydroxy groups and/or acid groups In one embodiment, at least two reactive groups (hydroxy and/or acid) should be available in the comonomer which reacts with the glycoluril. The polymerization reaction may be catalyzed with an acid. In another embodiment, the glycoluril compound may condense with itself or with another polyol, polyacid or hybrid compound, and additionally, incorporate into the polymer a compound with one hydroxy and/or one acid group. Thus, in an embodiment, the polymer comprises monomeric units derived from glycoluril and reactive compounds containing a mixture of hydroxy and/or acid groups.

In another embodiment, the polymer (b) of the anti-reflective coating composition may be a cross-linkable polymer which crosslinks with a crosslinker polymer or a crosslinking agent, such as the ones described herein. Polymers which are cross-linkable, include but are not limited to, copolymers of polyhydroxystyrene, such as poly(hydroxystyrene-methylmethacrylate); polyacrylates; polyesters and polyimides, where the polymer has crosslinking functional groups such as hydroxyl, carboxy, amide or imide groups. The polymer may be derived from comonomers that are acrylic acid or its esters, methacrylic acid or its esters, maleic anhydride, vinyl acetate, vinyl ether, acrylamide, vinyl carboxylic acid, vinyl alcohol or vinyl sulphonic acid. One or more of these monomers may be incorporated into the polymer. Some type of acrylate monomers used to form acrylate polymers are acrylic acid, butyl acrylate, 2-ethylhexyl acrylate, methyl acrylate, ethyl acrylate, acrylonitrile, methyl methacrylate, and trimethylolpropane triacrylate (TMPTA). Any of the crosslinkable polymers described in the following patent and patent applications may be used: U.S. Pat. No. 7,638,262, US 20060058468A1, and US 20100009297 A1.

Various other cross-linkable polymers may be used to crosslink with the crosslinker. Examples of cross-linkable polymers are polymers containing monomer units, which include but are not limited to, hydroxy containing acrylate monomers such as, for example, hydroxy ethyl acrylate, hydroxy propyl acrylate, hydroxy ethylhexyl acrylate, hydroxy butyl acrylate, hydroxy isodecyl acrylate, hydroxy lauryl acrylate, diethylene glycol monoacrylate, 2-hydroxy-3-phenoxypropyl acrylate, etc., and hydroxy containing methacrylate monomers corresponding to the above-mentioned acrylates, for example, hydroxy ethyl methacrylate, hydroxy propyl methacrylate, hydroxy ethylhexyl methacrylate, hydroxy butyl methacrylate, hydroxy isodecyl methacrylate, hydroxy lauryl methacrylate, diethylene glycol monomethacrylate, 2-hydroxy-3-phenoxypropyl methacrylate, etc.; allylic monomers, such as, for example, allyl alcohol, methallyl alcohol, alkoxylation products of allyl alcohol and methallyl alcohol with ethylene oxide, propylene oxide, and the like, and mixtures thereof, examples of which include allyl alcohol monopropoxylate and allyl alcohol monoethoxylate; styrene derivatives such as p-hydroxystyrene, m-hydroxystyrene, o-hydroxystyrene, α-methyl-p-hydroxystyrene, 4-hydroxy-2-methylstyrene, 4-h yd roxy-3-methylstyrene, 3-hydroxy-2-methylstyrene, 3-hydroxy-4-methylstyrene, 3-hydroxy-5-methylstyrene; amino group-substituted monomers include aminoethyl acrylate, t-butyl aminoethyl methacrylate, aminoethyl acrylate, aminoethyl methacrylate, 2-methyl aminoethyl methacrylate, 3-aminopropyl methacrylate, 4-aminocyclohexyl methacrylate, and 4-aminostyrene, etc.; carboxylic acid group-substituted monomers include acrylic acid, methacrylic acid, crotonic acid, vinylacetic acid and the like, etc.; sulfonic acid group-substituted monomers include vinylsulfonic acid, styrenesulfonic acid, vinylbenzylsulfonic acid, methallylsulfonic acid and the like, etc., as well as the corresponding sulfonamides, and the like, etc.

Monomers which may be polymerized into polymers, and used in the anti-reflective coating compositions of the present invention include, but are not limited to, aromatic vinyl compounds, such as styrene, alpha-methylstyrene, 4-methylstyrene, m-methylstyrene, 4-acetoxystyrene, 4-carboxystyrene, 4-aminostyrene, 4-methoxystyrene, 1,3-dimethylstyrene, tertbutylstyrene, vinylnaphthalene, and the like, etc.; polymers of styrene and methacrylates, e.g., poly p-hydroxystyrene-co-methyl methacrylate, poly p-hydroxystyrene, or poly 2-(methacryloyloxy)ethyl acetoacetate-co-methyl methacrylate; alkyl methacrylates such as methyl methacrylate, ethyl methacrylate, butyl methacrylate, hexyl methacrylate, 2-ethylhexyl methacrylate, cyclohexyl methacrylate, octyl methacrylate, dodecyl methacrylate, etc.; vinyl ethers such as ethyl vinyl ether, propyl vinyl ether, butyl vinyl ether, octyi vinyl ether, methoxyethyl vinyl ether, ethoxyethyl vinyl ether, hydroxyethyl vinyl ether, benzyl vinyl ether, tetrahydrofurfuryl vinyl ether, phenyl vinyl ether, tolyl vinyl ether and the like, etc.; alkyl acrylates such as methyl acrylate, ethyl acrylate, butyl acrylate, hexyl acrylate, 2-ethylhexyl acrylate, cyclohexyl acrylate, octyl acrylate, dodecyl acrylate, etc.; aryl methacrylates or alkylaryl methacrylates such as phenyl methacrylate, benzyl methacrylate; aryl acrylates or alkylaryl acrylates such as phenyl acrylate, benzyl acrylate; vinyl ethers and esters, etc. It is possible to use any other polymer that is customarily used for the preparation of polymers used in antireflective compositions. The polymer of the antireflective coating composition is present in the range of from about 5% to about 95% by total weight of the solid materials. Mixtures of different crosslinkable polymers or crosslinker polymers may be present in the novel composition.

A thermal acid generator of the present invention, is a compound which, when heated to temperatures greater than 90° C. and less than 300° C., generates an acid. The acid catalyses the crosslinking reaction in the composition, such as the crosslinking of the polymer(s) or crosslinker. After heat treatment, the antireflective coating becomes insoluble to solvents used for coating photoresists, and furthermore, is also insoluble in the alkaline developer used to image the photoresist. In an embodiment, the crosslinking takes place at 150° C. or higher, or 200° C. or higher. The antireflective film is heated for a sufficient time to crosslink the coating.

A thermal acid generator may be a thermal acid generator capable of generating a strong acid upon heating. The thermal acid generator (TAG) used in the present invention may be any one or more TAGs that upon heating generates an acid which can react with the crosslinkable polymer and propagate crosslinking of the polymer present in the invention, particularly preferred is a strong acid such as a sulfonic acid. Non-limiting examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Covalent thermal acid generators also are envisaged as useful additives, for instance 2-nitrobenzyl esters of alkyl or arylsulfonic acids and other esters of sulfonic acid which thermally decompose to give free sulfonic acids. Examples include diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters include 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including, those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAGs are Nacure 5225, and CDX-2168E, which is a dodecylbenzene sulfonic acid amine salt supplied at 25-30% activity in propylene glycol methyl ether from King Industries, Norwalk, Conn. 06852, USA. Another TAG may be amine salt of 1-nonafluorobutane sulfonic acid, or p-toluenesulfonic acid. Typically, a thermal acid generator is present in an antireflective compound in a concentration of from about 0.1 to about 10% by weight, preferably from about 0.1 to 7.0 percent weight total of the dry components of the composition, and more preferably from about 0.1 to 5.0 percent weight total of the dry components of the composition.

Examples of solvents for the antireflective coating composition include alcohols, esters, glymes, ethers, glycol ethers, glycol ether esters, ketones, lactones, cyclic ketones and mixtures thereof. Examples of such solvents include, but are not limited to, propylene glycol methyl ether (PGME), propylene glycol methyl ether acetate (PGMEA), cyclohexanone, 2-heptanone, ethyl 3-ethoxy-propionate, ethyl lactate, gamma valerolactone, methyl 3-methoxypropionate, methyl α-hydroxyisobutyrate and mixtures thereof. The solvent is typically present in an amount of from about 40 to about 99 weight percent. In certain instances, the addition of lactone solvents is useful in helping flow characteristics of the antireflective coating composition when used in layered systems. When present, the lactone solvent comprises about 1% to about 10% of the solvent system. Gamma-valerolactone is a useful lactone solvent.

The antireflective coating composition is coated on the substrate using techniques well known to those skilled in the art, such as spin coating, dipping or spraying. The film thickness ranges from about 0.005 micron to about 1 micron. Thicker antireflective coatings, up to 10 microns, may be used for planarization of substrates with topography. The antireflective coating is further heated on a hot plate or convection oven to remove any residual solvent and to render insoluble the antireflective film.

The photoresist coated over the antireflective coating can be any type used in the semiconductor industry, provided that the photoactive compound in the photoresist and the antireflective coating substantially absorb at the exposure wavelength used for the imaging process. The photoresist may use various techniques to provide imagewise exposure, such as radiation in the range of 450 nm to 10 nm, which include 248 nm, 193 nm and 13.4 nm.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 300 nm to 440 nm.

High resolution, chemically amplified, deep ultraviolet (100-300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. Nos. 4,491,628, 5,350,660, 5,843,624, 5,998,099, and 6,132,926. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by eliminating the aromatic functionality. Furthermore, at lower wavelengths the reflection from the substrate becomes increasingly detrimental to the lithographic performance of the photoresist. Therefore, at these wavelengths antireflective coatings become critical. The present composition is particularly useful for euv or 193 nm or 248 nm imaging.

The process of the instant invention further comprises coating a substrate with a novel antireflective coating composition, followed by heating on a hotplate or convection oven at a sufficiently high temperature for sufficient length of time to insolubilize the coating so as not to be soluble in the coating solvent of the photoresist or in the aqueous alkaline developer used to develop the photoresist. Various substrates known in the art may be used, such as those that are planar, have topography or have holes. The preferred range of temperature is from about 70° C. to about 250° C., preferably from about 130° C. to about 225° C. If the temperature is below 70° C. then insufficient loss of solvent or insufficient degree of insolubilization takes place and at temperatures above 250° C. the polymer may become chemically unstable. The exact temperature to be used is determined by the specific application. A film of a photosensitive material (photoresist) is then coated on top of the antireflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of photoresist used. The patterned substrate is then dry etched. The etching may be carried out in a suitable etch chamber to remove the exposed portions of the antireflective film, with the remaining photoresist acting as an etch mask. The present invention also provides methods of using said compositions as antireflective coatings for substrates in immersion lithography processes, wherein a high etch rate is achieved using the provided antireflective compositions. Optional heating steps may be included to optimize the etching process. Various etching techniques known in the art may be used.

After the coating process, the photoresist is image-wise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide (TMAH). The developer may further comprise surfactant(s). The developer may be a 2.38 weight % TMAH aqueous solution. The development time may be 60 seconds. An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings. With the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

The absorption parameter (k) of the novel composition ranges from about 0.1 to about 1.0, or from about 0.15 to about 0.7, or from about 0.2 to about 0.5 as measured using ellipsometry. The refractive index (n) of the antireflective coating is also optimized. In an embodiment, the refractive index (n value) at 193 nm approaches 2. In another embodiment, the n value is in the range of about of 1.94 to about 1.97. The refractive index value of the antireflective coating composition may be optimized to 1.9 or above. In an embodiment, the refractive index value of the antireflective coating composition is optimized to about 1.91 or above. In another embodiment, the refractive index value of the antireflective coating composition is optimized to about 1.92 or above. In a further embodiment, the refractive index value of the antireflective coating composition is optimized to about 1.93 or above. In an embodiment, the refractive index value of the antireflective coating composition is optimized to about 1.94 or above. In another embodiment, the refractive index value of the antireflective coating composition is optimized to about 1.95 or above. In still another embodiment, the refractive index value of the antireflective coating composition is optimized to about 1.96 or above. In a further embodiment, the refractive index value of the antireflective coating composition is optimized to about 1.97 or above. In a still further embodiment, the refractive index value of the antireflective coating composition is optimized to about 1.98 or above.

In one embodiment the refractive index of the composition may be 1.70 equal or greater than 1.70. The enhancer may be used as an additive for antireflective compositions wherein the refractive index of the composition is greater than 1.7.

The n and k values can be calculated using an ellipsometer, such as the J. A. Woollam WVASE VU-302 ™ Ellipsometer. The exact values of the optimum ranges for k and n are dependent on the exposure wavelength used and the type of application. Typically for 193 nm the preferred range for k is 0.1 to 0.75 or 0.2 to 0.5, for 248 nm the preferred range for k is 0.15 to 0.8 or 0.2 to 0.5, and for 365 nm the preferred range is from 0.1 to 0.8. The thickness of the antireflective coating is less than the thickness of the top photoresist.

Each of the documents referred to above is incorporated herein by reference in its entirety, for all purposes. The following specific examples will provide detailed illustrations of the methods of producing antireflective compositions of the present invention, the methods of use of the provided compositions to formulate antireflective coatings, and methods of using the provided antireflective coatings in image formation on photoresists. These examples are not intended, however, to limit or restrict the scope of the invention in any way and should not be construed as providing conditions, parameters or values which must be utilized exclusively in order to practice the present invention.

EXAMPLES

Synthesis Example 1

23 g of bis(2-carboxyethyl)isocyanurate and 16.7 g of ethylene glycol anhydrous were placed in a 500 ml flask. 150 g of 4M HCl dioxane solution was added under nitrogen. The mixture was stirred and temperature was gradually raised to 50, 60, 70, 80 degrees in ~1 hour. The reaction was allowed at reflux for 24 h at 96-97° C. The reaction solution was cooled down to room temperature and filtered. Solvent was evaporated after exposure in air for several days in a hood. After drying under vacuum at ~40° C., about 25 g of solid product was obtained.

Synthesis Example 2

In a flask fitted with a Dean-Stark trap, 600 g of bis(2-carboxyethyl)isocyanurate, 306.7 g of ethylene glycol and 8.0 g of para-toluenesulfonic acid monohydrate were added under nitrogen. The temperature was raised to 120° C. and maintain for one hour, then to 140° C. for one hour, then to 150° C. for one hour and finally to 160° C. for one hour. After temperature was raised to 150° C., nitrogen flushing was stopped and vacuum line was connected to remove water at 150-160° C. until the evolution of water ceased. After cooling down, the product was taken for GPC analysis. The product has an average MW of 1630 g/mol.

Synthesis Example 3

23 g of bis(2-carboxyethyl)isocyanurate and 16 g of ethylene glycol anhydrous were placed in a 500 ml flask. 150 g of 4M HCl dioxane solution was added under nitrogen. The mixture was stirred and temperature was gradually raised to 50, 60, 70, 80 degrees in ~1 hour. The reaction was allowed at reflux for 24 h at 96-97° C. The reaction solution was cooled down to room temperature and filtered. Solvent was removed by rotary evaporation to dryness. The product was obtained by recrystallization in isobutyl acetate. The solid was collected by filtration. After drying under vacuum at ~40° C., 12 g of white powdery product was obtained. The product has an average MW of 550 g/mol.

Synthesis Example 4

50 g of bis(2-carboxyethyl)isocyanurate was placed in a 500 ml flask. 400 g of 4M HCl methanol solution was added under nitrogen. The mixture was stirred and temperature was gradually raised to 55° C. for 30 minutes until a clear solution was obtained. The reaction was allowed at reflux 1 hour at 65 C. The reaction solution was cooled down to room temperature and filtered. The white solid was collected by filtration. After drying under vacuum at ~40° C., 45 g of dimethyl ester of bis(2-carboxyethyl)isocyanurate was obtained and characterized by proton NMR spectrotroscopy.

Synthesis Example 5

15 g of material from Synthesis Example 4 and 7 g of ethylene glycol anhydrous were placed in a 250 ml flask. 90 g of 4M HCl dioxane solution was added under nitrogen. The mixture was stirred and temperature was gradually raised to 50, 60, 70, 80 degrees in ~1 hour. The reaction was allowed at 90° C. for 24 hours. The reaction solution was cooled down to room temperature and filtered. Solvent was removed by rotary evaporation to dryness. The product was obtained by recrystallization in THF/t-butyl methyl ether. The solid was collected by filtration. After drying under vacuum at ~40° C., 6 g of white powdery product was obtained. The product has an average MW of 500 g/mol.

Synthesis Example 6

29 g of tris(2-carboxyethyl)isocyanurate and 20.8 g of ethylene glycol anhydrous were placed in a 500 ml flask. 150 g of 4M HCl dioxane solution was added under nitrogen. The mixture was stirred and temperature was gradually raised to 50, 60, 70, 80 degrees in ~1 hour. The reaction was allowed at reflux for 24 h at 80-90° C. The reaction solution was cooled down to room temperature and filtered. Solvent was removed by rotary evaporation. After drying under vacuum at ~40° C., an oil product was obtained.

Synthesis Example 7

110 g of tetramethoxymethyl glycoluril and 61 g of tris(2-hydroxyethyl)cyanuric acid were added in 350 g of dioxane. The temperature was raised to 92-94° C. and a clear solution was obtained. 0.7 g of PTSA was added and the reaction was allowed for 6 hours at reflux. After cooling down to room temperature, 0.5 g triethyl amine was added. The solution was precipitated in n-butyl acetate at 5° C. The polymer was filtered and dried under vacuum. The polymer obtained had a weight average molecular weight of about 2200 g/mol.

Synthesis Example 8

600 g of tetramethoxymethyl glycoluril, 96 g of styrene glycol and 1200 grams of propyleneglycol monomethyletheracetate (PGMEA) were charged into a 2 L jacketed flask with a thermometer, mechanical stirrer and a cold water condenser and heated to 85° C. After a catalytic amount of para-toluenesulfonic acid monohydrate was added, the reaction was maintained at this temperature for 5 hours. The reaction solution was then cooled to room temperature and filtered. The filtrate was slowly poured into distilled water while stirring to precipitate the polymer. The polymer was filtered, washed thoroughly with water and dried in a vacuum oven. 250 grams of polymer were obtained. The polymer obtained had a weight average molecular weight of about 17,345 g/mol and a polydispersity of 2.7.

Synthesis Example 9

10 g of butanetetracarboxylic acid dianhydride, 7 g of styrene glycol, 0.5 g of benzyltributylammonium chloride, and 35 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after ~1-2 hours. The temperature was kept at 110° C. for 3 hours. Upon cooling, 60 g of PGMEA and 36 g of propylene oxide were mixed with the above solution. The reaction was kept at 50° C. for 48 hrs. The reaction solution was cooled to room temperature and slowly poured into a large amount of water in a high-speed blender. The polymer was collected and washed thoroughly with water. Finally, the polymer was dried in a vacuum oven. 16 g of polymer was obtained with an average molecular weight (MW) of about 20,000 g/mol.

Formulation and Coating Example 1

0.7 g polymer from Synthesis Example 7 and 0.3 g of product from Synthesis Example 1 was dissolved in 30 g of methyl α-hydroxyisobutyrate solvent to make a 3.3 wt % solution. A mixture of 0.1 g of 10% of dodecylbenzene sulfonic acid triethylamine salt in PGMEA/PGME 70/30, 0.05 g of 10% of nonafluorobutanesulfonic acid triethylamine salt in PGMEA/PGME 70/30 was added to the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.97 and the absorption parameter "k" was 0.27.

Formulation and Coating Example 2

0.7 g polymer from Synthesis Example 7 and 0.3 g of product from Synthesis Example 3 was dissolved in 30 g of PGMEA/PGME 70/30 solvent to make a 3.3 wt % solution. A mixture of 0.03 g of 10% of dodecylbenzene sulfonic acid triethylamine salt in PGMEA/PGME 70/30, 0.03 g of 10% of nonafluorobutanesulfonic acid triethylamine salt in PGMEA/PGME 70/30 and 0.06 g of 10% of p-toluene sulfonic acid triethylamine salt in PGMEA/PGME 70/30 was added to the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.97 and the absorption parameter "k" was 0.27.

Formulation and Coating Example 3

0.7 g polymer from Synthesis Example 7 and 0.3 g of product from Synthesis Example 5 was dissolved in 30 g of methyl α-hydroxyisobutyrate solvent to make a 3.3 wt % solution. A mixture of 0.03 g of 10% of dodecylbenzene sulfonic acid triethylamine salt in PGMEA/PGME 70/30, 0.03 g of 10% of nonafluorobutanesulfonic acid triethylamine salt in PGMEA/PGME 70/30 and 0.06 g of 10% of p-toluene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.97 and the absorption parameter "k" was 0.27.

Formulation and Coating Example 4

0.7 g of polymer from Synthesis Example 7, 0.2 g of product from Synthesis Example 3, and 0.1 g of polymer from Synthesis Example 9 were dissolved in 30 g of PGMEA/PGME 70/30 solvent to make a 3.3 wt % solution. A mixture of 0.03 g of 10% of dodecylbenzene sulfonic acid triethylamine salt in PGMEA/PGME 70/30, 0.03 g of 10% of nonafluorobutanesulfonic acid triethylamine salt in PGMEA/PGME 70/30 and 0.06 g of 10% of p-toluene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.94 and the absorption parameter "k" was 0.29.

Formulation and Coating Example 5

0.3 g of polymer from Synthesis Example 7, 0.5 g of product from Synthesis Example 8 and 0.2 g of product from Synthesis Example 3 was dissolved in 30 g of PGMEA/PGME 70/30 solvent to make a 3.3 wt % solution. A mixture of 0.03 g of 10% of dodecylbenzene sulfonic acid triethylamine salt in PGMEA/PGME 70/30, 0.03 g of 10% of nonafluorobutanesulfonic acid triethylamine salt in PGMEA/PGME 70/30 and 0.06 g of 10% of p-toluene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.94 and the absorption parameter "k" was 0.30.

Formulation and Coating Example 6

0.8 g polymer from Synthesis Example 7 and 0.2 g of product from Synthesis Example 3 was dissolved in 30 g of PGMEA/PGME 70/30 solvent to make a 3.3 wt % solution. A mixture of 0.03 g of 10% of dodecylbenzene sulfonic acid triethylamine salt in PGMEA/PGME 70/30, 0.03 g of 10% of nonafluorobutanesulfonic acid triethylamine salt in PGMEA/PGME 70/30 and 0.06 g of 10% of p-toluene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.96 and the absorption parameter "k" was 0.27.

Lithography Performances Example 1

The performance of the anti-reflective coating formulation from Formulation and Coating Example 1 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 50 nm thick film. Then a 25 nm thick film of Formulation and Coating Example 1 after dilution was coated over and baked at 205° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns at 80 nm L/S 1:1 with a photo speed of 40 mJ/cm$^2$ showed no standing waves, no footing and no scumming, indicating efficacy of the bottom anti-reflective coating.

Lithography Performances Example 2

The performance of the anti-reflective coating formulation from Formulation and Coating Example 2 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 50 nm thick film. Then a 25 nm thick film of Formulation and Coating Example 2 after dilution was coated over and baked at 205° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns at 80 nm L/S 1:1 with a photo speed of 40 mJ/cm$^2$ showed no standing waves, no footing and no scumming, indicating efficacy of the bottom anti-reflective coating.

Lithography Performances Example 3

The performance of the anti-reflective coating formulation from Formulation and Coating Example 4 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 50 nm thick film. Then a 26 nm thick film of Formulation and Coating Example 4 after dilution was coated over and baked at 205° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns at 80 nm L/S 1:1 with a photo speed of 40 mJ/cm$^2$ showed no standing waves, no footing and no scumming, indicating efficacy of the bottom anti-reflective coating.

Lithography Performances Example 4

The performance of the anti-reflective coating formulation from Formulation and Coating Example 5 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 50 nm thick film. Then a 26 nm thick film of Formulation and Coating Example 5 after dilution was coated over and baked at 205° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns at 80 nm L/S 1:1 with a photo speed of 40 mJ/cm$^2$ showed no standing waves, no footing and no scumming, indicating efficacy of the bottom anti-reflective coating.

Lithography Performances Example 5

The performance of 45 nm 1:1 L/S (line/space) on Formulation and Coating Example 4 was evaluated with 193 nm immersion lithography using illumination conditions of

What is claimed is:

1. An antireflective coating composition comprising a) a compound of formula 1, b) a thermal acid generator, and (c) at least one polymer,

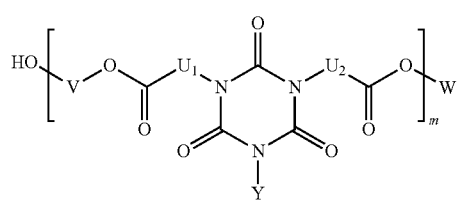

(1)

wherein $U_1$ and $U_2$ are independently a $C_1$-$C_{10}$ alkylene group; V is selected from a $C_1$-$C_{10}$ alkylene, arylene and aromatic alkylene; W is selected from H, alkyl, aryl, alkylaryl and V—OH; Y is selected from H, W, and $U_3C(O)OW$, wherein $U_3$ is independently a $C_1$-$C_{10}$ alkylene group, and m is 1.

2. The antireflective coating composition of claim 1, where the polymer is a crosslinker polymer.

3. The antireflective coating composition of claim 1, where the polymer is a crosslinkable polymer.

4. The antireflective coating composition of claim 1, further comprising a crosslinker.

5. The antireflective coating composition of claim 1, where the polymer is polymeric glycoluril.

6. The antireflective coating composition of claim 1, wherein the thermal acid generator is selected from iodonium salts, tosylates, derivatives of benzene sulfonic acid salts, and derivatives of naphthalene sulfonic acid salts.

7. The antireflective coating composition of claim 4, wherein the crosslinker is selected from melamines, methylols, glycolurils, polymeric glycolurils, hydroxy alkyl amides, epoxy and epoxy amine resins, blocked isocyanates, and divinyl monomers.

8. The antireflective coating composition of claim 1, wherein the refractive index value of the composition at 0.193 nm is 1.9 or above.

9. The antireflective coating composition of claim 1, wherein the refractive index value of the composition at 193 nm is in the range of about of 1.9 to about 2.0.

10. The antireflective coating composition of claim 1, wherein the refractive index value of the composition at 193 nm is at about 1.91, 1.92, 1.93, 1.94, 1.95, 1.96 or 1.97.

11. The antireflective coating composition of claim 1, where the absorption parameter k value as measured by ellipsometry is in the range of about 0.2 to about 0.7.

12. A process for forming an image on a photoresist comprising:
(a) coating and baking a substrate with the anti-reflective coating composition of claim 1;
(b) coating and baking a layer of photoresist film on top of the anti-reflective coating;
(c) image-wise exposing the photoresist with exposure equipment to radiation;
(d) developing an image in the photoresist; and
(e) optionally, baking the substrate after the exposing step.

13. The process of claim 12, where the photoresist is image-wise exposed at wavelengths between 13 nm to 250 nm.

14. The process of claim 12, where the photoresist is image-wise exposed at a wavelength of 193 nm.

15. The process of claim 12, where the antireflective coating is baked at temperatures greater than 90 C and less than 300° C.

* * * * *